United States Patent
Kim

(10) Patent No.: US 7,638,096 B2
(45) Date of Patent: Dec. 29, 2009

(54) PHOTORESIST COATING FAILURE SENSING METHODS AND DETECTION DEVICES

(75) Inventor: Ook Hyun Kim, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 954 days.

(21) Appl. No.: 10/875,967

(22) Filed: Jun. 24, 2004

(65) Prior Publication Data
US 2004/0266012 A1 Dec. 30, 2004

(30) Foreign Application Priority Data
Jun. 24, 2003 (KR) .................. 10-2003-0040944

(51) Int. Cl.
*G01N 33/00* (2006.01)
(52) U.S. Cl. .................. 422/82.13; 73/1.06; 73/1.26; 73/31.04; 438/14
(58) Field of Classification Search .......... 436/2, 436/5; 427/8, 9, 10; 73/1.06, 1.26, 37.5, 73/37.6; 324/754
See application file for complete search history.

(56) References Cited

U.S. PATENT DOCUMENTS

| | | | | |
|---|---|---|---|---|
| 3,729,966 A | * | 5/1973 | Khoury et al. | 430/30 |
| 4,607,525 A | * | 8/1986 | Turner et al. | 73/37.5 |
| 5,233,203 A | * | 8/1993 | Haga | 250/559.41 |
| 5,939,130 A | | 8/1999 | Shiraishi et al. | |
| 6,522,385 B2 | | 2/2003 | Ahn et al. | |

* cited by examiner

*Primary Examiner*—Robert J Hill, Jr.
*Assistant Examiner*—Dwan A Gerido
(74) *Attorney, Agent, or Firm*—Saliwanchik, Lloyd & Saliwanchik

(57) ABSTRACT

Methods and devices for detecting photoresist coating failures are disclosed. A disclosed method to detect a photoresist coating failure on a semiconductor wafer comprises: loading a photoresist coated wafer on a notch position check block; rotating the coated wafer; detecting the position of a notch in the wafer; blowing air toward the surface of the wafer with at least one air nozzle located over the rotating wafer; detecting an amount of the air blown from the at least one air nozzle; and generating a coating failure signal if a variation in the amount of air blown from the at least one air nozzle is indicative of a photoresist coating failure.

7 Claims, 4 Drawing Sheets

PHOTORESIST COATING FAILURE SENSING METHODS AND DETECTION DEVICES

FIELD OF THE DISCLOSURE

The present disclosure relates generally to semiconductor fabrication, and, more particularly, to methods and devices for detecting photoresist coating failures on a semiconductor wafer.

BACKGROUND

To form a photoresist layer on a semiconductor substrate (typically prior to an implanting process and an etching process) a conventional process coats the surface of a semiconductor wafer with a photoresist material. Next, the photoresist material disposed on the surface of the wafer is masked, exposed, and developed to provide a patterned photoresist layer.

The process for coating the surface of the wafer with the photoresist material is performed in a coating device. The coating device dispenses the photoresist material onto the semiconductor wafer while concurrently rotating the wafer to uniformly coat the semiconductor wafer.

Throughout the coating process, the wafers are softly baked and then remain in the buffer unit of an interface block before being moved to an exposure device. A process for exposing the wafers in the buffer unit includes: (a) moving a top positioned wafer in a queue of the buffer unit to a wafer notch position check block by means of a wafer loader, (b) checking orientation flatness with LED sensors to detect the position of a notch during the several rotations of the wafer, (c) conveying the roughly aligned wafer to a wafer stage, and (d) precisely aligning and then performing an exposing process for the wafer on the wafer stage.

Conventionally, a method for sensing a coating failure of the semiconductor wafer is performed prior to the exposing process. This sensing method performs a statistical sample test for a few wafers in a lot or a batch by means of detecting equipment or macrography after the completion of the development process for the photoresist material on the wafer.

Photoresist coating failures may cause serious problems such as yield loss during the later implanting process and the etching process. In other words, areas having coating failures cannot provide important functions such as implant blocking mask and etch resistance mask, thereby resulting in defective chips.

Thus, the test process for developed wafers is an essential part in the formation of a photoresist layer.

However, a full inspection for all wafers may cause a decrease in productivity and throughput. As a result, instead of an inspection of all wafers, the above-described sample test is performed after the exposing process. Since, by definition, the sample test does not test all of the wafers, unsampled wafers with coating failures may remain throughout the later processes. Thus, unsampled wafers with coating defects will not be detected and will, thus, likely escape the process for stripping and re-coating the photoresist material. These defective and unrepaired wafers cause problems and may result in a severe yield loss.

Shiraishi et al., U.S. Pat. No. 5,939,130 describes a coating film forming method for forming a resist coating film on an upper surface of a wafer held by a spin chuck in a chamber.

Ahn et al., U.S. Pat. No. 6,522,385 describes an air shower head for an exposure device of photolithography equipment without chemical substances that could otherwise contaminate a photoresist layer on a semiconductor wafer and degrade the profile of the photoresist pattern.

The above-mentioned patents do not detect photoresist coating failures on a semiconductor wafer while simultaneously sensing a notch in the wafer.

DETAILED DESCRIPTION

Figure 1:
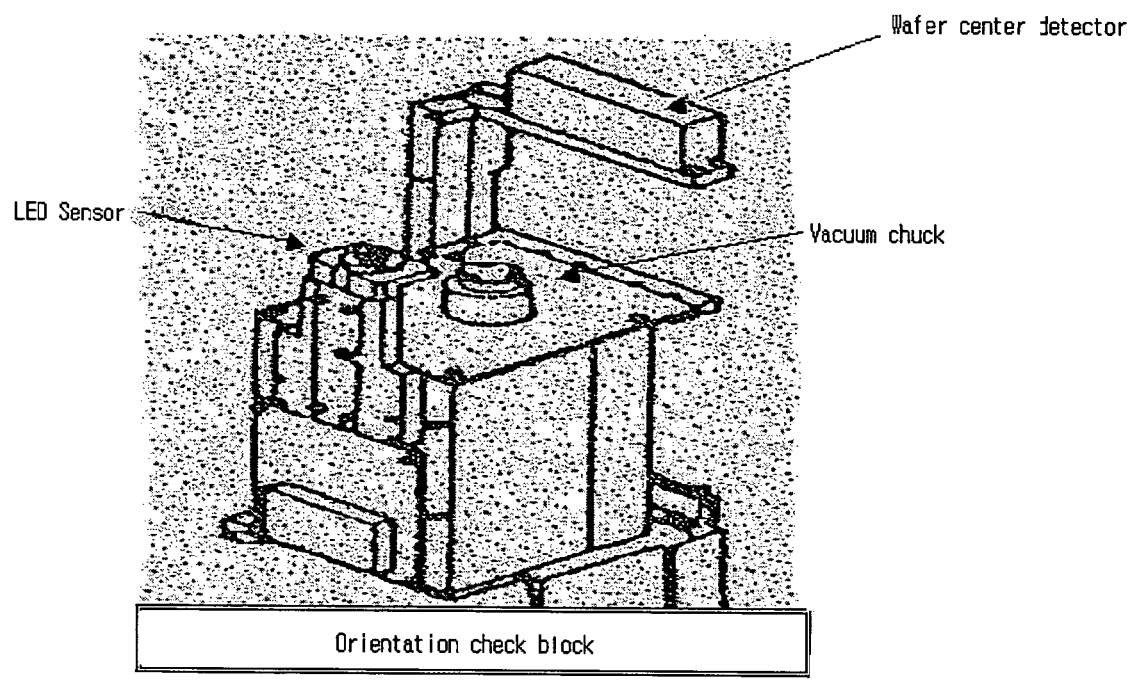
FIG. 1 illustrates a conventional wafer notch check block.
Figure 2A:
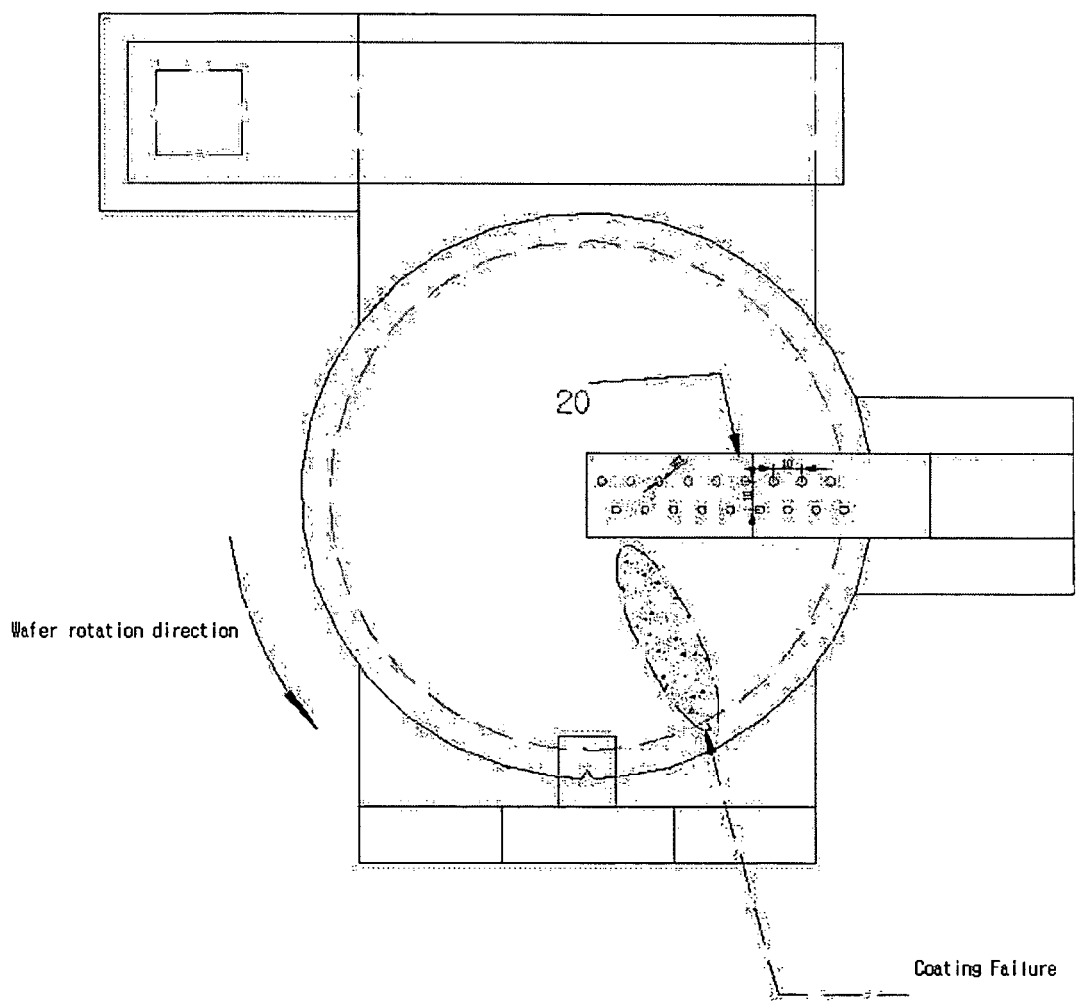
FIGS. 2a through 2c are schematic views of an example device constructed in accordance with the teachings of the invention for detecting photoresist coating failures.
Figure 2B:
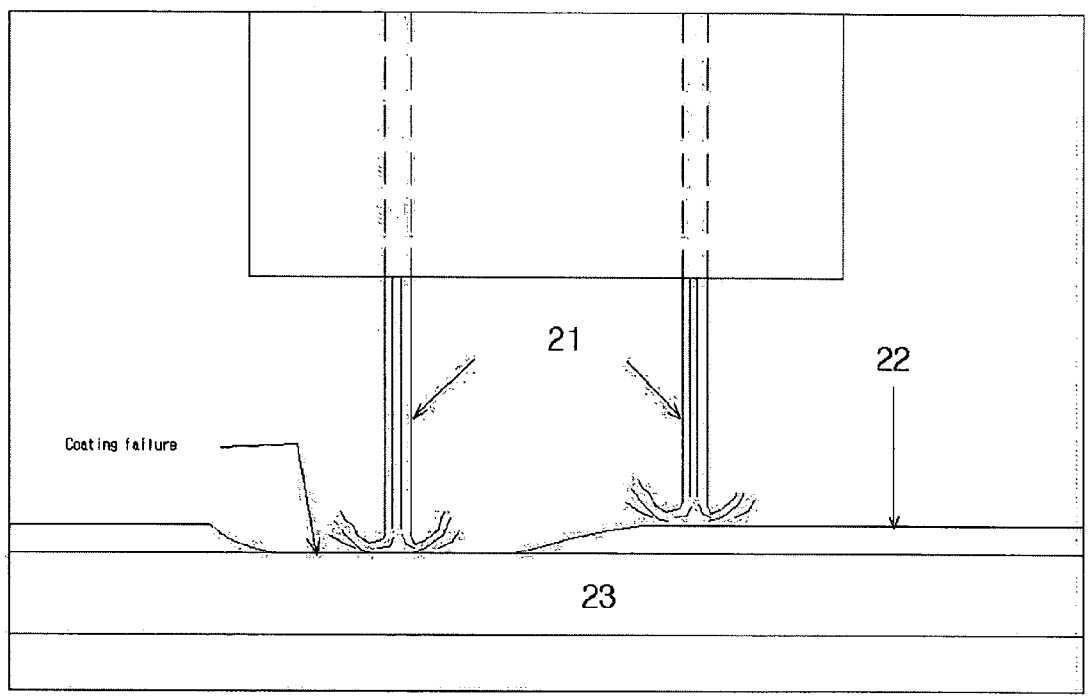
Figure 2C:
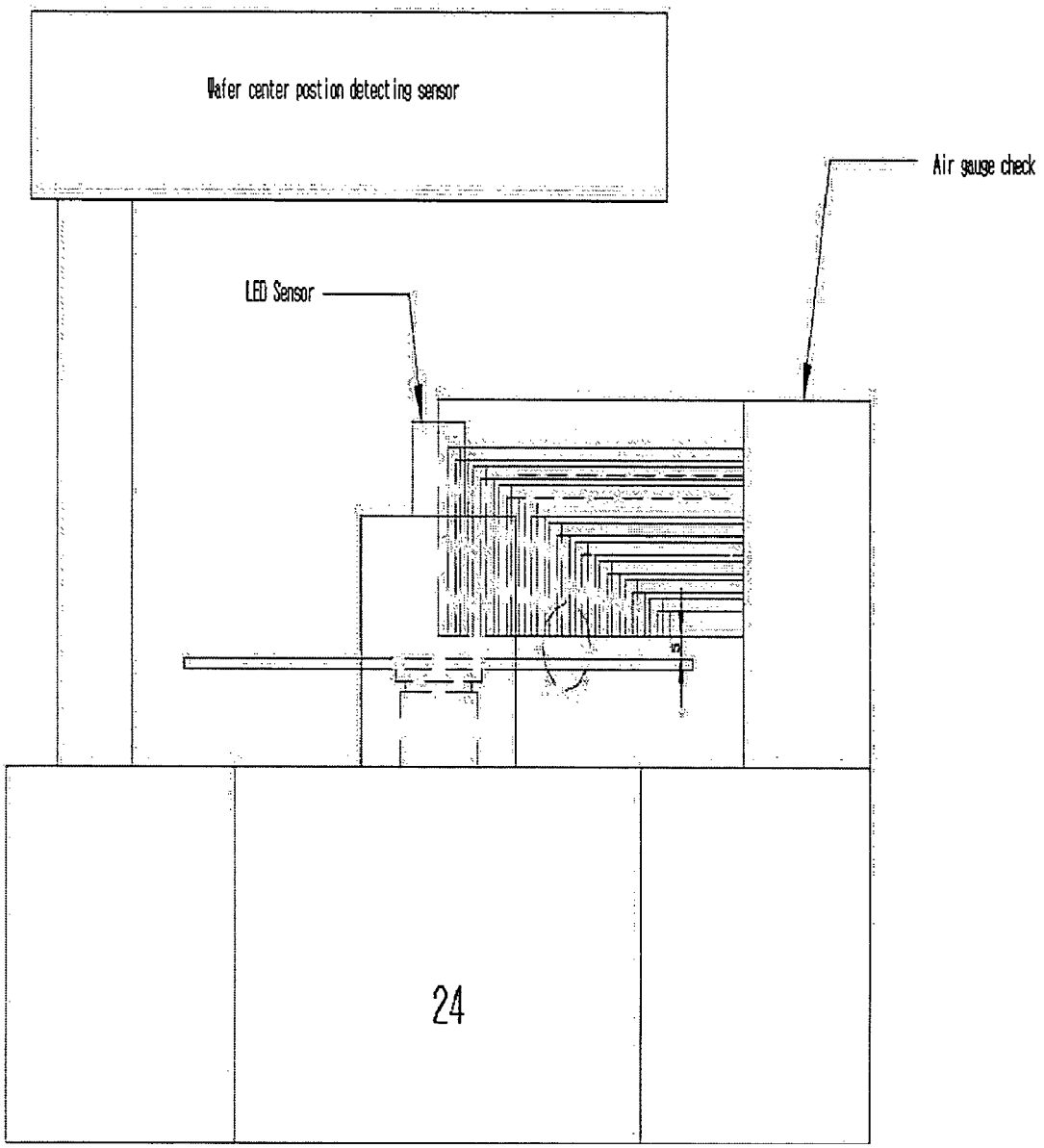

FIGS. 2a through FIG. 2c are schematic views of an example device for detecting photoresist coating failures.

In the illustrated example, a wafer 23 (for which a photoresist 22 coating process and a soft-baking process have been completed) is conveyed to an interface buffer unit for a subsequent exposing process. The wafer waiting in the interface buffer unit is moved to a flat orientation check block 24 by a wafer loader. Upon being placed onto a vacuum chuck of the flat orientation check block 24 by the wafer loader, the wafer 23 is rotated several times on the spinning vacuum chuck and the position of the notch is detected by a notch detecting light emitting diode (LED).

Air gauges for detecting coating failures are concurrently driven while the wafer is rotated several times on the spinning vacuum chuck. More specifically, air is blown from several air nozzles connected with the air gauges toward the surface of the semiconductor wafer. The air nozzles are placed horizontally over the radius of the wafer. The air nozzles are positioned over the top surface of the wafer at a distance of about 3 mm to 8 mm.

The amount of air blown from the air nozzles toward the surface of the wafer 23 is monitored by the air gauges. If the photoresist material 22 is uniformly coated on the surface of the wafer 23, the amount of air blown from the nozzles will be constant while the wafer is rotated to search for the position of the notch. If a variation exists in the target thickness (about 600 mm-3500 mm) of the photoresist layer (e.g., the surface of the semiconductor wafer is rough), the amount of air 21 blown into the areas of coating failures will be different from the amount of air blown at the areas of the surface without photoresist coating failures. The presence of a coating failure increases the distance from the air nozzle to the wafer and affects the air pressure. Thus, the resistance to air flow over the coating failure decreases and air flow from the air nozzle increases. The variation in the amount of the air blown is observed by the air gauges. An indication of coating failures is generated when such a failure is detected. The occurrence of such a photoresist coating failure is reported to an operator through a signal amplifier. A process for stripping and re-coating the photoresist material 22 on the wafers 23 may then be started.

An example device for detecting photoresist coating failures comprises several air nozzles positioned over the surface of a wafer 23 located on an orientation flatness check block 24. The air nozzles are located a predetermined distance above the wafer 23 to permit blowing of air toward the wafer 23. The example device also includes air gauges (see FIG. 2C) for detecting the amount of air blown through respective ones of the air nozzles. A control device is also provided for identifying photoresist coating failures and for generating a photoresist coating failure signal based on the information from the air gauges. The detection device may also include a display device for displaying information in response to the photoresist coating failure signal.

The air nozzles are preferably placed horizontally over the surface of the wafer 23 at a distance of about 3 mm to about 8 mm. A diameter of each of the air nozzles is preferably about 3 mm. Two rows and nine columns (i.e., a total of eighteen) of air nozzles are preferably installed. Each of the air nozzles is connected with a respective one of eighteen air gauges installed in an air gauge block 20. The variation in the amount of the air 21 blown from the air nozzles is detected by the air gauges. A signal amplifier is coupled to the air gauges in order to convert the detected variations in the amount of the air blown into an amplified signal.

From the foregoing, persons of ordinary skill in the art will appreciate that the above disclosed methods and apparatus can detect photoresist coating failures on wafers without adversely effecting productivity and/or throughput and while decreasing yield loss by performing a full inspection of each wafer, which was impossible with the conventional methods.

The disclosed example methods and apparatus detect photoresist coating failures while sensing the position of a notch in a semiconductor wafer during orientation flatness check. In other words, the position of a notch of a wafer and coating failures are simultaneously detected by using air gauges installed in an air nozzle block. When an operator reads information on a display device indicating that a photoresist coating failure has been detected, he/she may initiate a process for stripping and re-coating the photoresist material on the wafer suffering from the coating failure.

An example method disclosed herein detects photoresist coating failures by loading a wafer coated with softly baked photoresist on a notch position check block, rotating the wafer, detecting the position of a notch in the wafer, blowing air toward the surface of the rotating wafer with several air nozzles installed over the top surface of the wafer, detecting the amount of the air blown from the air nozzles toward the surface of the semiconductor wafer, and generating a coating failure signal if a variation in the amount of air blown from the air nozzles due to a photoresist coating failure occurs.

In addition, an example device disclosed herein for detecting photoresist coating failures includes: an orientation check block 24 to detect the position of a notch by means of one or more LED sensors during the rotations of a wafer. It also includes air nozzles positioned a distance over the surface of a wafer to blow air toward a wafer placed on the orientation flatness check block. The example device further includes air gauges for detecting the amount of the air blown through the air nozzles, a control device for determining that a photoresist coating failure has occurred and for generating a photoresist coating failure signal based on the output of the air gauges, and a display device to display information conveyed by the photoresist coating failure signal.

Although the above described examples include air nozzles that blow air at a rotating wafer and air gauges which detect air flow or pressure, persons of ordinary skill in the art will appreciate that other types of gases, nozzles and/or gauges may alternatively be employed.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A device to detect photoresist coating failures comprising:
    a sensor to detect the position of a notch in a rotatino wafer, the sensor being capable of detecting the notch while the wafer is rotating;
    at least one nozzle positioned over the rotating wafer to blow gas perpendicularly toward the rotating wafer;
    at least one gauge to detect an amount of gas blown through the at least one nozzle; and
    a control device to identify a photoresist coating failure based on an output of the at least one gauge.

2. A device as defined in claim 1, further comprising a display device in communication with the control device to display information indicative of a photoresist coating failure if a photoresist coating failure is identified by the control device.

3. A device as defined in claim 1, wherein the at least one nozzle is placed horizontally over a radius of the wafer.

4. A device as defined in claim 1, wherein the at least one nozzle is positioned about 3 to 8 mm above the wafer.

5. A device as defined in claim 1, wherein a diameter of each of the at least one nozzle is about 3 mm.

6. A device as defined in claim 1, wherein the at least one nozzle comprises eighteen air nozzles arranged in 2 rows and 9 columns.

7. A device as defined in claim 1, wherein the gas is air.

* * * * *